United States Patent
Lamy et al.

(10) Patent No.: US 7,079,052 B2
(45) Date of Patent: Jul. 18, 2006

(54) METHOD OF DECODING A VARIABLE-LENGTH CODEWORD SEQUENCE

(75) Inventors: Catherine Lamy, Paris (FR); Lisa Meilhac, Le Cannet (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 319 days.

(21) Appl. No.: 10/494,741
(22) PCT Filed: Nov. 13, 2002
(86) PCT No.: PCT/IB02/04782

§ 371 (c)(1),
(2), (4) Date: May 7, 2004

(87) PCT Pub. No.: WO03/043202
PCT Pub. Date: May 22, 2003

(65) Prior Publication Data
US 2004/0259098 A1 Dec. 23, 2004

(30) Foreign Application Priority Data
Nov. 13, 2001 (EP) ............................................. 01402911

(51) Int. Cl.
*H03M 7/40* (2006.01)
(52) U.S. Cl. .............................. 341/67; 341/65; 341/79
(58) Field of Classification Search .................. 341/67, 341/65, 79, 106, 51, 60, 86
See application file for complete search history.

(56) References Cited

U.S. PATENT DOCUMENTS 5,253,053 A * 10/1993 Chu et al. ............... 375/240.23
5,537,444 A * 7/1996 Nill et al. .................... 375/341
5,635,931 A * 6/1997 Franaszek et al. ............ 341/51
6,128,412 A * 10/2000 Satoh .......................... 382/246

OTHER PUBLICATIONS

Peros–Meilhac et al, "Huffman tree based metric derivation for a low–complexity sequential soft VLC decoding", 2002 IEEE International Conference on Communications, Apr. 28–May 2, 2002, vol. 1 or 5, pp. 783–787.

"Buttigieg–Variable–length error–correcting codes—Victor Buttigieg, PhD thesis, University of Manchester, United Kingdom, 1995" no month.

* cited by examiner

*Primary Examiner*—John B Nguyen

(57) ABSTRACT

The present invention relates to a method of source decoding of a variable-length codeword sequence, the decoding being based on an associated codeword table. It is characterized in that it comprises the steps of: creating a tree with tree-paths (T-PTH) and branches (B), decoding a received sequence (SQr), the step comprising the sub-steps of: extending the best tree-paths (BT_PTH) in the tree by computing first cumulative metrics (CM_LPTH) of the succeeding branches (B), selecting the codewords (CWDi) corresponding to the best tree-paths (BT_PTH), and saving corresponding data in paths (PTH), the corresponding data comprising second cumulative metrics (CM_STCK), reordering the saved paths (PTH) in accordance with their second cumulative metrics (CM_STCK), testing a priori conditions on top path (TOP_PTH), and if they are verified, outputting said top path, or otherwise returning to the extension substep.

12 Claims, 10 Drawing Sheets

| Si | CWDi | LTHi | Pi |
|---|---|---|---|
| S1 | 0 | 1 | 0,5 |
| S2 | 101 | 3 | 0,17 |
| S3 | 100 | 3 | 0,15 |
| S4 | 110 | 3 | 0,08 |
| S5 | 1110 | 4 | 0,06 |
| S6 | 1111 | 4 | 0,04 | ps
METHOD OF DECODING A VARIABLE-LENGTH CODEWORD SEQUENCE

This is a 371 of PCT/IB02/04782 filed Nov. 13, 2002.

FIELD OF THE INVENTION

The present invention relates to a method of source decoding a variable-length codeword sequence, said source decoding being based on an associated codeword table. The invention also relates to a decoder, said decoder utilizing said method.

Such a method may be used in any system using variable-length codes like, for example, a video or audio communication system.

BACKGROUND OF THE INVENTION

A video communication system typically comprises a source encoding system, a channel and a source decoding system. Said source encoding system generates variable-length codeword sequences and transmits them through said channel to said source decoding system that decodes them by virtue of a shared code.

As there are some perturbations on the channel, a received codeword sequence contains errors; hence, there is a plurality of possible decoded codeword sequences.

The source decoder then acts as an estimator of the received sequence by selecting one of the possible decoded codeword sequences based on a best metric between all the metrics associated with these possible sequences. The computation of the best metric is usually called metric derivation. Such an estimation is usually based either on a Viterbi algorithm or on a stack algorithm, said stack algorithm being described in the reference "Buttigieg-Variable-length error-correcting codes—PhD thesis, University of Manchester, United Kingdom, 1995".

One major problem of such an estimation is that said estimation requires a computation of the metric associated with each codeword in each decoding step. Hence, the best partially decoded codeword sequence is extended by all the codewords, i.e. all the metrics of all the codewords are calculated, then a new best-codeword at a considered time is chosen as a function of its metric and is extended again by all the codewords until a number of extended codewords is equal to a received codeword sequence length. This computation makes a metric derivation used in the Viterbi or stack algorithms the most costly part of decoding in terms of central processing unit (cpu) requirements.

OBJECT AND SUMMARY OF THE INVENTION

Accordingly, it is an object of the invention to provide a method and a decoder of source decoding a variable-length codeword sequence, said source decoding being based on an associated codeword table, which achieves an efficient decoding for a reasonable cpu cost, time and complexity.

To this end, there is provided a method of decoding variable-length codeword sequences as defined in claim 1.

In addition, there is provided a source decoder for decoding variable-length codeword sequences as defined in claim 12.

As we will see in detail in the further description, such a method has the great advantage that the codewords are selected in an increasing order of their metric value. Thus, by searching only useful codewords, the proposed method is very efficient in terms of CPU cost, complexity and time, because the other codewords are not taken into account anymore.

It is another object of the invention to further decrease the decoding in terms of complexity and rapidity.

Accordingly, in a first preferred embodiment, each codeword has a length, and the tree comprises a number of levels equal to the maximum codeword length defined in the codeword table. As the number of levels within the tree has a reasonable value, it leads rapidly to a result without having to use too many computations.

In a second preferred embodiment, the extension sub-step comprises a stop metric computation conditions test, such that, if said conditions are verified, the extension is stopped and is followed by the sub-step of reordering paths, the stop metric computation conditions test being based on a comparison of the first cumulative metric of the best tree-path with the worst saved path's second cumulative metric. Thus, it allows extension of only the useful best tree-paths, and consequently examination of only the useful associated codewords.

Moreover, in a third preferred embodiment, if a priori conditions are based on symbols criteria, the selection sub-step is adapted to select only a codeword, which has a length different from all previously selected codeword lengths within a decoding step. Thus, we avoid examining codewords, which are worse than those already selected.

In a fourth preferred embodiment, the decoding step further comprises a sub-step of testing end conditions on the top path before testing the a priori conditions, such that, if said top path verifies end conditions, the sub-step of testing the a priori conditions is performed, or otherwise a sub-step of testing stop decoding conditions is performed, and if said stop decoding conditions are not verified, a return to the extension step takes place. The end conditions allow testing whether we have reached a possible result, which has some characteristics equal to those of the received sequence.

In a preferred embodiment, these characteristics are the length of the received codeword sequence, which is the number of bits within the received codeword sequence. Hence, the corresponding data in paths further comprising a cumulative number of bits, and the end conditions are based on a comparison of the top path's cumulative number of bits with the length of the received codeword sequence.

In another preferred embodiment, the stop decoding conditions are based on an incrementation of a decoding step counter and on a comparison of said counter with a set threshold, such that if said counter exceeds said threshold, the decoding is stopped. Thus, it avoids taking too much time to look for a result for a decoded sequence, which result may not exist or take an unreasonable time to find.

BRIEF DESCRIPTION OF THE DRAWINGS

Additional objects, features and advantages of the invention will become apparent upon reading the following detailed description and upon reference to the accompanying drawings in which.

DETAILED DESCRIPTION OF THE INVENTION

In the following description, well-known functions or constructions known to a person skilled in the art are not described in detail since they would obscure the invention in unnecessary detail.

Figures 1, 2:
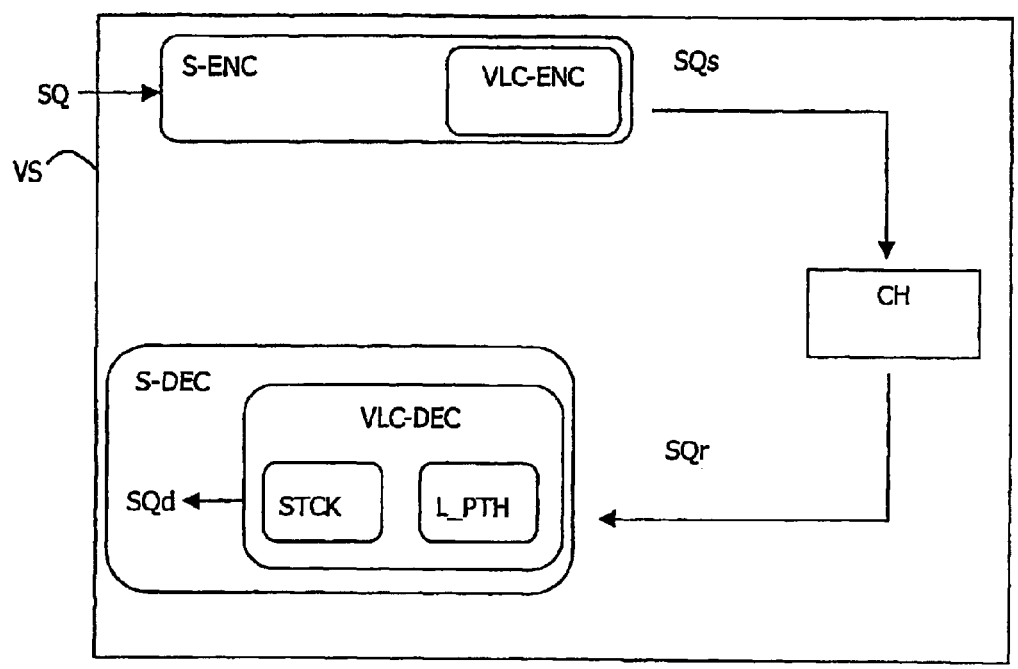
FIG. 1 illustrates a communication system model comprising an encoder and a decoder according to the invention.
FIG. 2 is a codeword table associated with the variable-length codeword sequences decoder of FIG. 1.

The present invention relates to a method of source decoding a variable-length codeword sequence based on an associated codeword table also usually called Huffman code. Said method is used in particular in a Variable-Length-Code decoder called VLC decoder as shown in FIG. 1 within a video communication system VS. Besides, said video communication system VS comprises a source encoding system S-ENC comprising a VLC encoder VLC-ENC, a channel CH and a source decoding system S-DEC comprising said VLC decoder VLC_DEC. The source encoding system S-ENC encodes a symbol sequence to a codeword sequence SQ via the VLC encoder and transmits it through said channel CH during a plurality of bit times to said source decoding system S-DEC which decodes it via the VLC decoder VLC-DEC by virtue of a shared code C defined in the codeword table. The transmission is made bit by bit.

A codeword sequence SQ has a variable length L_SQ. This means that the sent codeword sequences SQs may have different lengths; hence, the received codeword sequences SQr, which are received by the decoding system S_DEC, may have different lengths. A codeword-sequence SQ comprises a plurality of symbols S that are defined through the shared code C. Note that one symbol S comprises at least one bit.

An example of a codeword table is given in FIG. 2. The shared code C is defined as follows. A codeword CWDi is associated with a symbol Si, a codeword CWDi having a length LTHi. A value of a codeword CWDi also represents the value that may be taken by the associated symbol Si. Besides, a probability of appearance Pi is associated with each codeword CWDi.

Thus, with such a shared code C, a sent codeword sequence SQs is defined as follows. For instance, SQs=100 0 110. This codeword sequence comprises 3 symbols S3 S1 S4 and contains 7 bits. Then, after a step of modulation in the source encoding system S-ENC, for instance a BPSK modulation, which step is well known to those skilled in the art, said sequence is equal to SQs'=1; −1; −1; −1; 1; 1; −1. Then, because of noise on the channel CH, the sequence received by the source decoding system S_DEC is, for example, SQr=0.8–0.9–0.8–1.1 1.2–1.3.

From now on, the received sequence SQr must be decoded to recover the sent sequence SQs. In other words, we have to recover the symbols Si that have been sent in said sent sequence SQs. Because of the perturbations, which lead to errors, we notice that there may be many possible decoded codeword sequences SQd. The decoding is made by the VLC decoder VLC_DEC, and is based on an estimation of the sequence sent SQs.

Said VLC decoder VLC_DEC comprises:

A tree-path list L_PTH, which contains a set of tree-paths T_PTH, each tree-path comprising a first cumulative metric CM_LPTH and a set of nodes NSET, and the tree-path list contains a top tree-path which is the best tree-path according to the cumulative metrics, and A stack STCK, which contains a set of paths PTH, each path comprising data, said data comprising a second cumulative metric CM_STCK and a cumulative number of bits CBITS, and a set of symbols Si.

The first cumulative metric CM_LPTH of a tree-path is a sum of the branch metrics of the branches B composing said tree-path T_PTH plus an initialization cumulative metric defined hereinafter.

The second cumulative metric CM_STCK of a path is a sum of the metrics of the symbols Si composing said path PTH. As mentioned above, a symbol Si is associated with a codeword CDWi.

In order to find the correct decoded codeword sequence SQd, the decoding method uses a tree representation of the considered codeword table, and a metric derivation algorithm. A tree is composed of nodes N and branches B as described hereinafter. Considering that a metric can be associated with each branch B of the tree, the decoding method searches the most likely tree-path in the tree that can be used to determine the codewords CWDi with the smallest metric at a considered time t. As we will see, one great advantage of the proposed method is that codewords are selected in an increasing order of their metric value.

I) METRIC DERIVATION ALGORITHM.

The metric derivation algorithm uses a bit-by-bit branch metrics recursive formulation and the afore-mentioned tree representation.

A Bit-by-bit Branch Metrics Recursive Formulation

The metric computation is done in accordance with the Massey metric (as described in the reference J. L. Massey "Variable-Length codes and the Fano metric" IEEE Transactions on Information Theory, IT-18(1):196–198, January 1972) which is an approximation "Maximum A Posteriori" criterion called MAP criterion, equivalent, as is well known to those skilled in the art, to the computation of a Euclidean distance between a partial received sequence SQr and the partial sent sequence SQs after modulation (in case of an Additive White and Gaussian Noise), followed by a weighting by a factor depending on the codeword probabilities of appearance and a corrective factor logP0(y) which approximate the likelihood of the received sequence y, x being a sent sequence.

The formula of the metric M is:

$$M(x, y) = -\log P(x|y) = -\log P(y|x) - \log P(x) + \log P0(y) \quad [1]$$

where $$P0(y) = \sum_{t=0}^{nb\_bit} P(x[t] = 0)P(y[t]|x[t] = 0) + P(x[t] = 1)P(y[t]|x[t] = 1)$$

The nb_bit is the number of bits within a sequence SQ.

Therefore, a bit by bit branch metric formulation can be written as:

$$M(CWDi, y[t:t+LTHi]) = \sum_{k=0}^{LTHi-1} m(CWDi[k], y[t+k]) \quad [2]$$

Where $m(CWDi[k], y[t+k]) = \log P(y[t+k]|CWDi[k]) - \log P(x[t+k]=CWDi[k]|x[t:t+k-1]) + \log P_0(Y[t+k])$ is a branch metric associated with an nth branch of the tree-path corresponding to a codeword CWDi CWDi[k] is the kth bit of the codeword CWDi.

The term logP(y[t+k]|CWDi[k]) represents a distance, the term logP(x[t+k]=CWDi[k]|x[t:t+k-1]) an a priori probability associated with the kth bit of the codeword CWDi and logP0(y[t+k]) a corrective factor.

Tree Representation of the Codeword Table

Such a tree comprises a plurality of:

nodes N, a plurality of nodes corresponding to a possible codeword CWDi;

branches B, a metric being associated with a branch B. A branch B is composed of two nodes N, in other words, from a node N, one or two branches can be created, a "left" branch and a "right" branch; a branch has an associated bit value 0 or 1;

tree-paths T_PTH, a tree-path T_PTH representing a decoded codeword sequence SQd. A tree-path T_PTH comprises a plurality of branches B and goes from an initial node N00 to a possible symbol Si.

Besides, a tree has different levels, the first one being the level 0, and a tree comprises an initial node N00.

Computation of a Metric

In the metric derivation algorithm, we examine the tree-paths in the tree, leaving from the initial node N00 and follow them until one tree-path reaches a symbol S. A list of previously examined tree-paths is kept in storage. A list entry contains the last node of the examined tree-path along with its first cumulative metric i.e. a sum of the branch metrics of branches composing this tree-path. Each decoding step leads to an extension of the top tree-path in the tree-path list (that is the best tree-path having the smallest cumulative metric) by computing the branch metrics of the succeeded branches of its last node (one or two by construction) and then adding it to the first cumulative metric of the top tree-path to form successors. The top tree-path is then deleted from the tree-path list and its successors are inserted. When the top tree-path in the list corresponds to a complete codeword CWDi, this codeword is added to a list of main best codewords CWD_LIST. The operation is repeated until stop conditions are verified.

Figure 4:
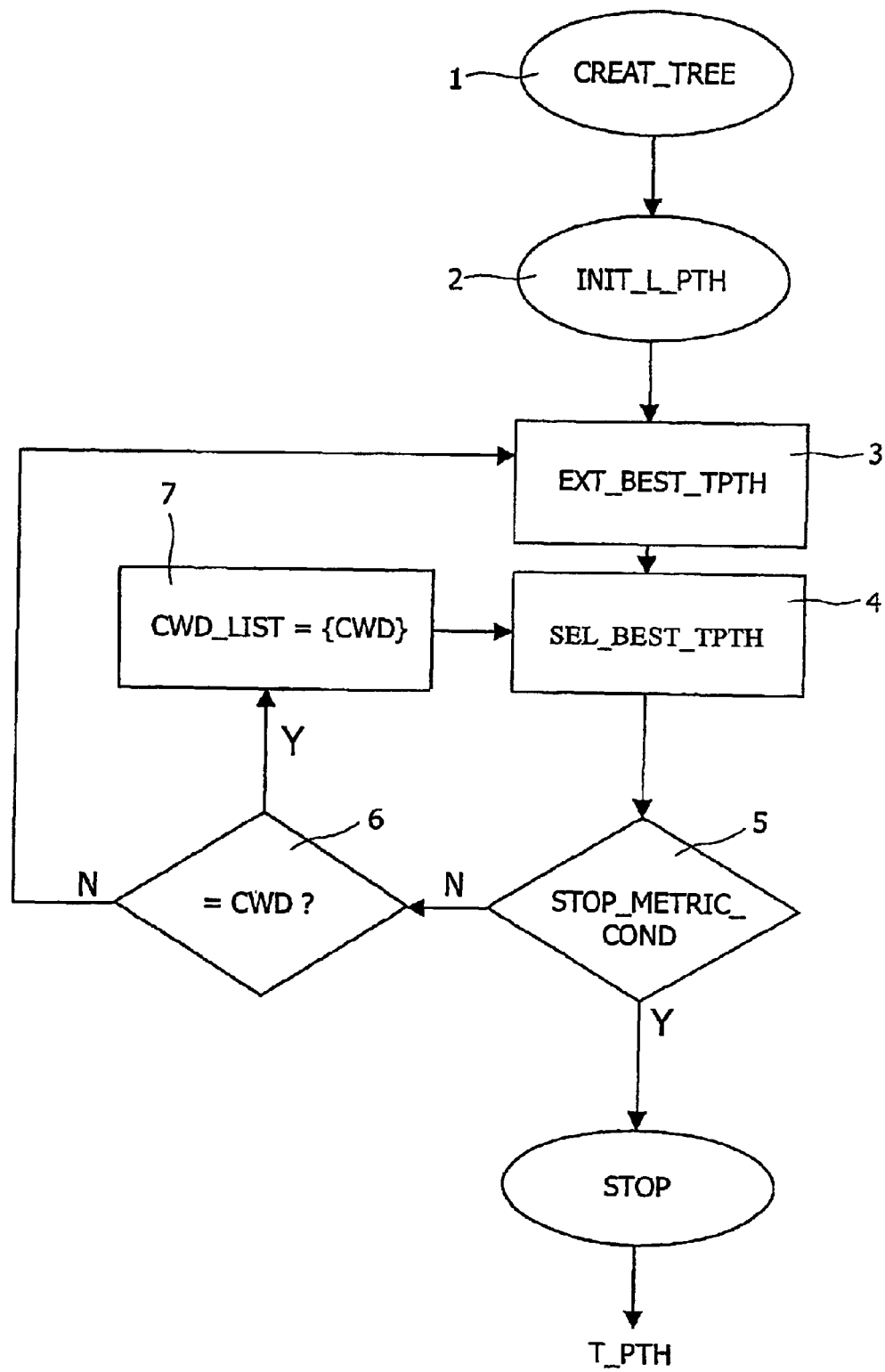
FIG. 4 is a first state diagram showing a metric derivation computation used by the variable-length codeword sequences decoder of FIG. 1.

Thus, the metric derivation algorithm performs the following steps, as shown in FIG. 4.

In a 1$^{st}$ step CREAT_TREE), we create a tree associated with the codeword table. We create the tree by defining relations between nodes N computing the a priori probability logP(x[t+k]=CWDi[k]|x[t:t+k-1]), as described in the reference "L.Guivarch, Carlach, Siohan—Joint Source Channel soft decoding of Huffmann codes with turbo-codes. In Proceedings of the Data compression Conference DCC'00 pages 83–91, Snowbird, Utah, USA, March 2000", associated with each branch B. Note that in a preferred embodiment, the number of levels of a tree is equal to the maximum codeword length LTHi defined in the codeword table, i.e. here it is 4.

In a 2$^{nd}$ step INIT_L_PTH), we initialize the tree-path list L_PTH by placing the initial node N00 with metric 0 in the top tree-path list L_PTH.

In a 3$^{rd}$ step EXT_BEST_TPTH), we compute the metric of the succeeding branches of the best tree-path BT_PTH in the tree-path list L_PTH. We delete the best tree-path BT_PTH from the tree-path list L_PTH, and insert the extended tree-paths T_PTH in the tree-path list.

In a 4$^{th}$ step SEL_BEST_TPTH), we select the new best tree-path BT_PTH i.e. the tree-path of the tree-path list L_PTH that has the smallest first cumulative metric.

In a 5$^{th}$ step STOP_METRIC_COND), we test some stop metric computation conditions. If one of the stop conditions is verified, we stop, otherwise we continue to the 6$^{th}$ step.

Several stop conditions can be defined. In preferred embodiments, the following stop conditions can be verified.

If each node N has been examined, we stop.

If a sufficient number of codewords CWDi has been selected, we stop.

If the first cumulative metric CM_LPTH corresponding to the best tree-path exceeds a certain threshold, which is here the worst second cumulative metric CM_STCK, we stop. This last condition is preferably used.

In a 6$^{th}$ step), we test whether the best tree-path BT_PTH corresponds to a complete codeword CWDi. If yes, we continue to the 7$^{th}$ step. Otherwise, we return to the 3$^{rd}$ step.

In a 7$^{th}$ step), we add to the codeword list CWD_LIST the found codeword CWDi, corresponding to the best tree-path BT_PTH and return to the 4$^{th}$ step.

Note that it is possible that some codewords CWDi found will not be used by the estimation method, in particular, if several codewords CWDi of equal length (number of bits within the codeword) are selected i.e. when some a priori conditions are-based on symbol criteria as will be described below.

II) Decoding Method or VLC Algorithm

Figure 5A:
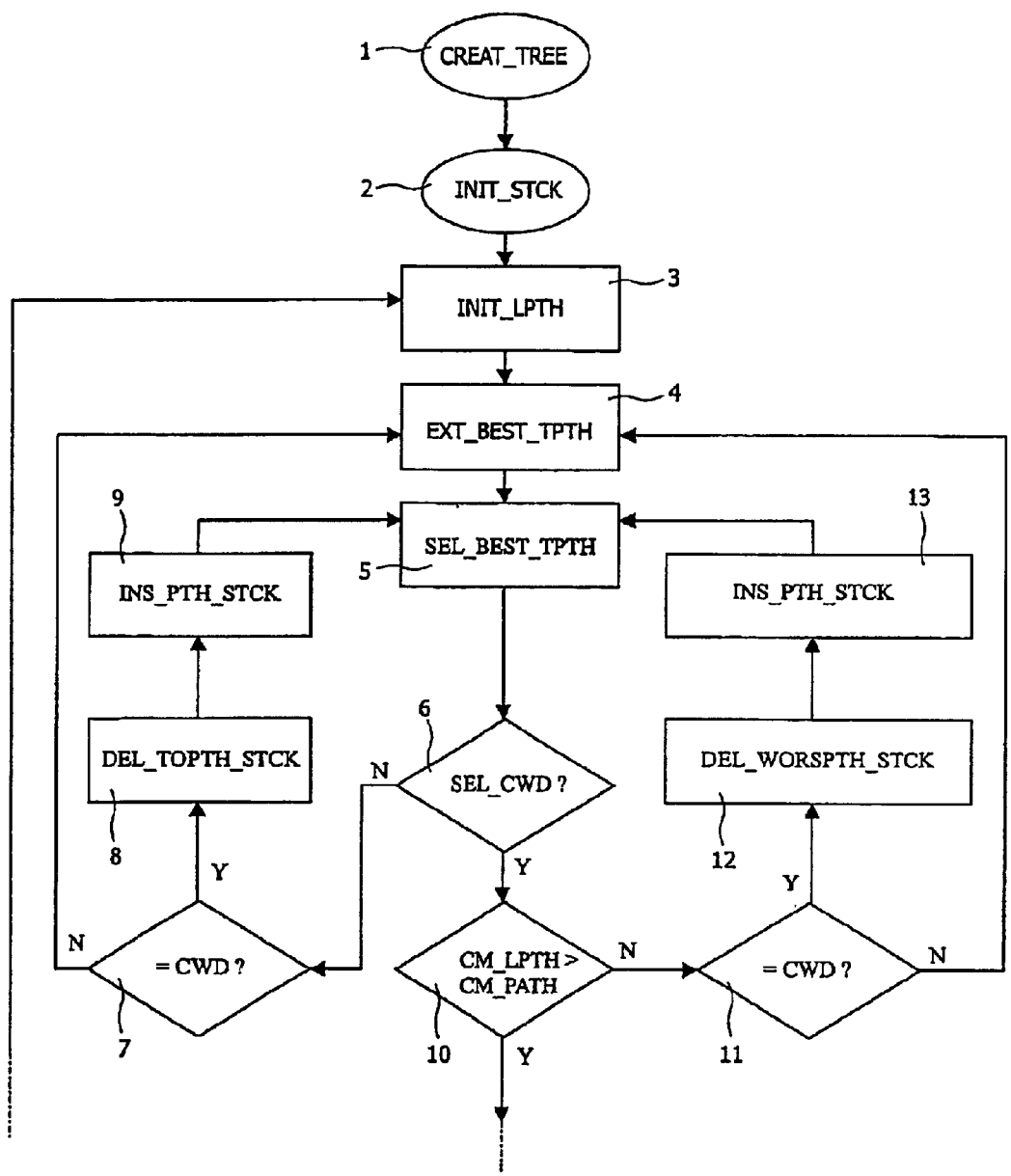
FIG. 5a is a second state diagram showing variable code sequence estimation used by the variable-length codeword sequences decoder of FIG. 1.
Figure 5B:
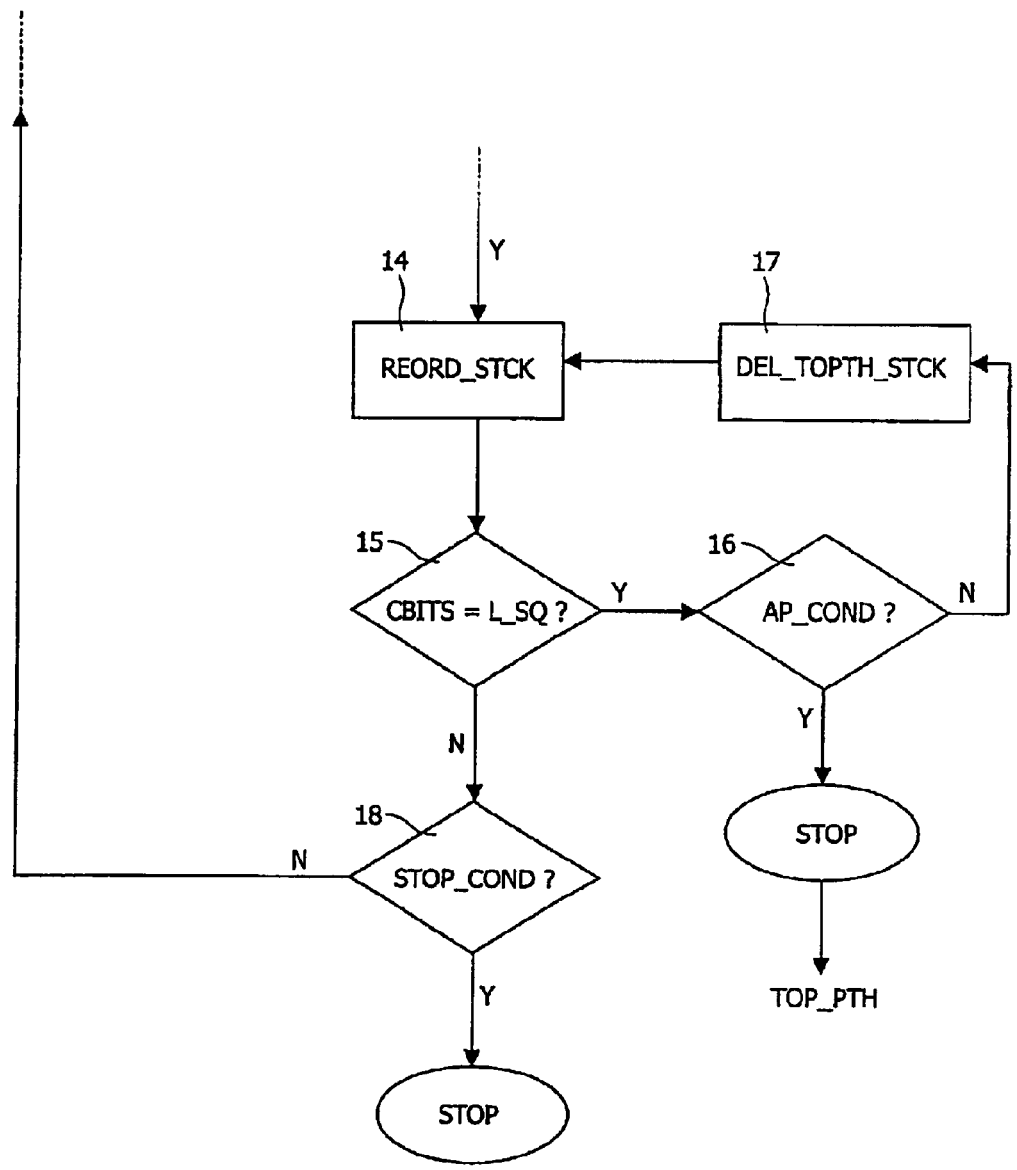
FIG. 5b is the following of the second state diagram showing variable code sequence estimation used by the variable-length codeword sequences decoder of FIG. 1.

Now we will see how the decoding method, also called TREE-VLC-STACK algorithm, uses this metric derivation algorithm by performing the following steps, as shown in FIGS. 5a and 5b.

Figure 3:
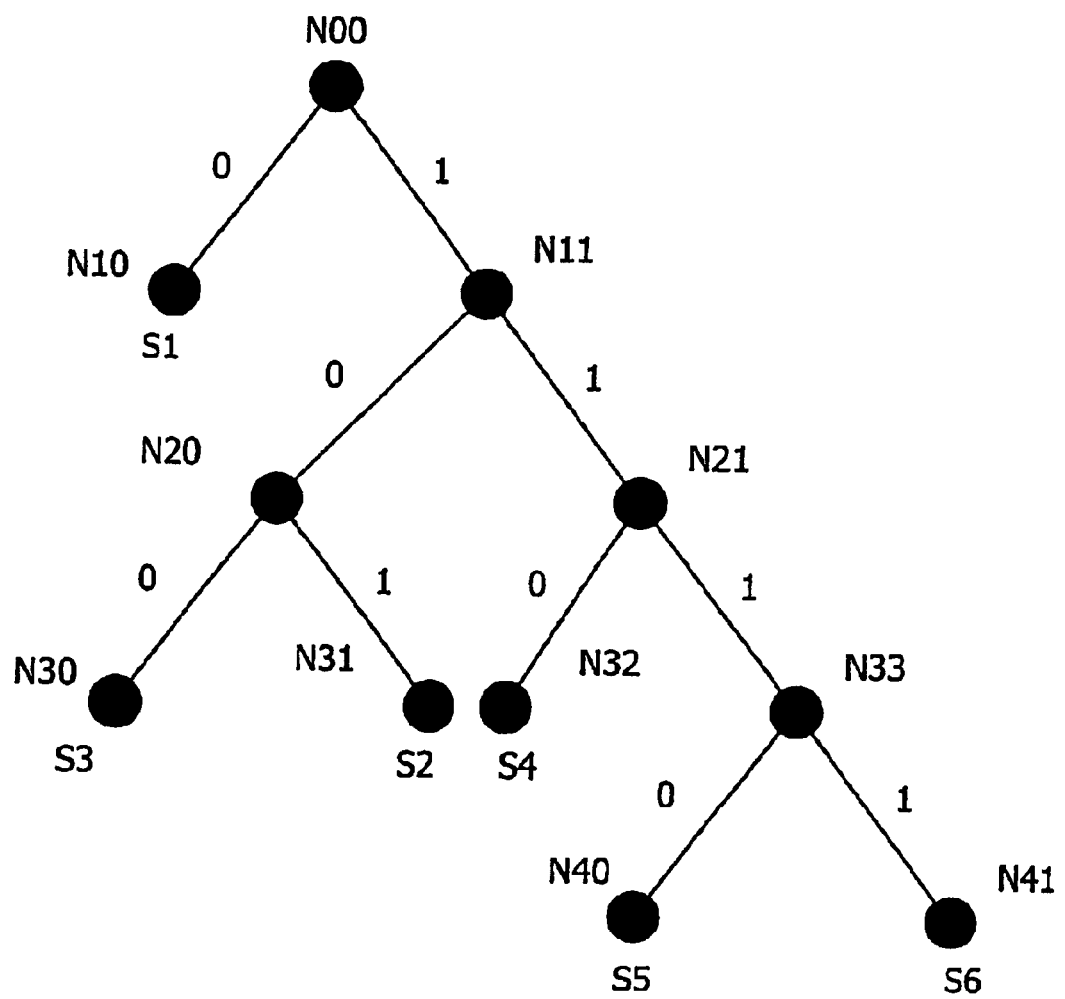
FIG. 3 is a representation of a code tree associated with the codeword table of FIG. 2.

In a 1$^{st}$ step CREAT_TREE), we create the tree associated with the codewords table as mentioned above. The tree is illustrated in FIG. 3. Here, its number of levels is equal to 4.

After having created the associated tree, in a 2$^{nd}$ sub-step INIT_STCK), we initialize the stack STCK by putting a zero metric in the top entry of said stack STCK and by putting infinite metric in other entries.

In a 3rd sub-step INIT_L_PTH), we initialize the tree-path list L-PTH by placing the initial node N00 with the initialization cumulative metric being the top path's second cumulative metric CM_STCK of the stack STCK.

In a 4th sub-step EXT_BEST_T_PTH), we extend the tree-paths T_PTH from the best tree-path BT_PTH, and we compute the first cumulative metric CM_LPTH of the succeeding branches B. Then, we delete the best tree-path in the tree-path list L_PTH and insert the extended tree-paths in said tree-path list L_PTH.

In a 5$^{th}$ sub-step SEL_BEST_TPTH), we select the new best tree-path BT_PTH i.e. the tree-path which has the best first cumulative metric CM_LPTH i.e. the smallest cumulative metric, in the tree-path list L_PTH.

In a 6$^{th}$ sub-step SEL_CWD), If from the last pass by the step 3, at least one selected best tree-path BT_PTH was a codeword, go to step 10. If not, go to step 7.

In a 7$^{th}$ sub-step=CWD), we test if the best tree-path BT_PTH corresponds to a complete codeword CWDi. Thus, if the best tree-path BT_PTH corresponds to a complete codeword, we delete the best tree-path BT_PTH from the tree-path list L_PTH, then we go to step 8, otherwise we return to step 4.

Note that in the case the a priori conditions are based on symbol criteria, we preferably test whether this corresponding complete codeword CWDi has a length LTHi different from all of the previously selected codeword lengths from the last pass by the step 3.

If it has an equal length, we delete the best tree-path BT_PTH from the tree-path list L_PTH, then we return to step 5. It means that this codeword CWDi is not worth being examined, as it has been selected after another, which has the same length, it is worse than this other codeword. Hence, this test has the advantage of gaining time.

If it has a different length, we delete the best tree-path BT_PTH from the tree-path list L_PTH, then we go to step 8.

In an 8$^{th}$ sub-step DEL_TOPTH_STCK), we delete the top path TOP_PTH from the stack STCK.

In a 9$^{th}$ sub-step INS_PTH_STCK), we insert the new path PTH formed from the best extended path, in the stack STCK, by selecting the codeword CWDi obtained in step 7. Then we return to step 5.

In a 10$^{th}$ sub-step CM_LPTH>CM_STCK), we test the stop metric computation conditions. Thus, we compare the first cumulative metric of the best tree-path with the worst saved path's cumulative metric. Hence, if the first cumulative metric CM_LPTH of the best tree-path BT_PTH in the tree-path list L_PTH exceeds the second cumulative metric CM_STCK of the worst path PTH in the stack STCK, we go to step 14. It means that the first cumulative metric of the best tree-path BT_PTH is worse than the second cumulative metric of the worst path PTH. Otherwise, go to step 11.

In an 11$^{th}$ sub-step=CWD), if the best tree-path BT_PTH in the tree-path list L_PTH corresponds to a complete codeword CWDi, we delete the best tree-path BT_PTH from the tree-path list L_PTH, then we continue to step 12. Otherwise, we return to step 4, i.e. we continue to look for a corresponding codeword CWDi.

In a 12$^{th}$ sub-step DEL_WORSPTH_STCK), we delete the worst path PTH in the stack STCK, i.e.; the path which has the greatest cumulative metric.

In a 13$^{th}$ sub-step INS_PTH_STCK), we insert in the stack STCK the new path PTH formed from the extended best path, in the stack STCK, by the selected codeword CWDi obtained at step 11, then we return to step 5.

In a 14$^{th}$ sub-step REORD_STCK), we reorder the stack STCK according to the second cumulative metrics values CM_STCK from the best to the worse.

In a 15$^{th}$ sub-step CBITS=L_SQ), we test end conditions on top path. Thus, we compare the top path's cumulative number of bits with the length of the received codeword sequence. If the top path's cumulative bits CBITS is equal to the received sequence SQr length L_SQ, we continue to step 16. Otherwise, we go to step 18.

In a 16$^{th}$ sub-step AP_COND), we test if the top path TOP_PTH in the stack STCK verifies a priori conditions on the emitted sequence.

The a priori conditions are preferably the number of symbols Si or the number of blocks within a sequence. In this example, the a priori conditions are the number of symbols Si. If it does verify the a priori conditions, we stop, and we output said top path TOP_PTH, which is the decoded solution to the received sequence SQs. Otherwise, we go to step 17.

In a 17$^{th}$ sub-step DEL_TOPTH_STCK), we delete the top-path PTH from the stack STCK, and put infinite metric in the top path's entry of the stack STCK, then we go to step 14.

In an 18$^{th}$ sub-step STOP_COND), we test the stop decoding conditions. Thus, we increment a counter CPT corresponding to a number of decoding steps, and we compare said counter CPT with a set threshold TH. If said counter CPT exceeds a given threshold TH, the decoding is stopped. It means that no solution has been found. For example, the threshold TH is set to 3*the number of bits in the sent sequence SQs. Otherwise, we return to step 3.

III) Illustrated Example

1st Step: Creation of the tree

Such a tree is illustrated in FIG. 3. In this Figure, the tree associated with the codeword table of FIG. 2 has 6 symbols S1 to S6, 11 nodes N00 to N40 and 10 branches. It has a first node N00. For example, it has a tree-path N00–N11–N20–S3 which is composed of the three intermediate nodes N00–N11–N20 forming the symbol S3, said nodes being equivalent to 3 branches B1(N00–N11), B2(N11–N20), B3(N20, N30). The 3 branches have the associated bit values "1", "0", and "0", respectively.

Note that we represent a node Nk1 with indexes with k=level of the tree. For example, N20 means that this node is at the second level of the tree.

Step 2: initialization of the stack STCK. Here, the stack has 2 paths PTH: PTH1 and PTH2.

| CM_STCK | CBITS | STAT |   |
|---------|-------|------|---|
| 0       | 0     | 0    | PTH1 |
| ∞       |       |      | PTH2 |

Step 3: initialization of the tree-path list L_PTH.

| CM_LPTH | NSET |        |
|---------|------|--------|
| 0       | N00  | T_PTH00 |

Step 4: extension
Hence, we have two extended tree-paths: T_PTH10 and T_PTH11.

| CM_LPTH | NSET       |         |
|---------|------------|---------|
| M10     | N00 – N10  | T_PTH10 |
| M11     | N00 – N11  | T_PTH11 |

Step 5: In the example, the best tree-path is the tree-path BT_PTH=T_PTH11 (N00–N11).

Step 6: There was not any codeword selected before. Hence, we go to step 7

Step 7: Here, the best tree-path BT_PTH=T_PTH11 (N00–N11) does not correspond to any codeword, thus, we return to step 4.

Step 4: we have two extended tree-paths T_PTH20 TPTH21

| CM_LPTH     | NSET              |         |
|-------------|-------------------|---------|
| M10         | N00 – N10         | T_PTH10 |
| M11 + M20   | N00 – N11 – N20   | T_PTH20 |
| M11 + M21   | N00 – N11 – N21   | T_PTH21 |

Step 5: The new best tree-path is BT_PTH=T_PTH20.
Step 6: There was not any codeword selected before. Hence, we go to step 7.
Step 7: Here, the best tree-path BT_PTH=T_PTH20 (N00–N11–N20) does not correspond to any codeword, thus, we return to step 4.
Step 4:

| CM_LPTH         | NSET                  |         |
|-----------------|-----------------------|---------|
| M10             | N00 – N10             | T_PTH10 |
| M11 + M21       | N00 – N11 – N21       | T_PTH21 |
| M11 + M20 + M30 | N00 – N11 – N20 – N30 | T_PTH30 |
| M11 + M20 + M31 | N00 – N11 – N20 – N31 | T_PTH31 |

Step 5: We arrive at a best tree-path BT_PTH=T_PTH30 with a first cumulative metric M11+M20+M30.

Step 6: From the last pass by the step 3, no selected best tree-path BT_PTH was a codeword, we go to step 7.

Step 7: as the best tree-path BT_PTH=T_PTH30 corresponds to a complete codeword 100, we delete the best tree-path BT_PTH=T_PTH30 from the tree-path list, then we go to step 8.

Step 8: delete top path TOP_PTH=PTH1 in the stack STCK.

Step 9: We insert the new path PTH by selecting the codeword CWDi obtained at step 7. Said codeword CWDi comprises 3 bits 100 and corresponds to the symbol S3. Hence, the new path PTH1 comprises the following data: the second cumulative metric M10+M20+M30, the value of 3 bits, and the symbol S3.

| CM_STCK           | CBITS | STAT |      |
|-------------------|-------|------|------|
| MP1 = M11 + M20 + M30 | 3     | S3   | PTH1 |
| ∞                 | 0     |      | PTH2 | we return to step 5.

| CM_LPTH         | NSET                  |         |
|-----------------|-----------------------|---------|
| M10             | N00 – N10             | T_PTH10 |
| M11 + M21       | N00 – N11 – N21       | T_PTH21 |
| M11 + M20 + M31 | N00 – N11 – N20 – N31 | T_PTH31 |

Step 5: We select the new best tree-path BT_PTH=T_PTH10.

Step 6: At least one of the selected best tree-path BT_PTH was a codeword, thus go to step 10.

Step 10: The first cumulative metric of the best tree-path T_PTH10 is less than second-cumulative-metric of the worst path from the stack, here, it is infinite, go to step 11

Step 11: The new best tree-path BT_PTH=T_PTH10 corresponds to a new codeword 0 and to the symbol S1, thus we delete the best tree-path BT_PTH=T_PTH10 from the tree-path list, then we go to step 12.

Step 12: We delete the worst path from the stack.

Step 13: we insert in the stack STCK, the new path PTH by selecting the codeword obtained in step 11. Thus, in the stack STCK, we have the path PTH2 with a second cumulative metric M10 and 1 bit and the symbol S1, as shown hereinafter.

| CM_STCK           | CBITS | STAT |      |
|-------------------|-------|------|------|
| MP1 = M11 + M20 + M30 | 3     | S3   | PTH1 |
| MP2 = M10         | 1     | S1   | PTH2 |

We return to step 5. We select the new best tree-path BT_PTH=T_PTH31

Step 6, step 10: The first cumulative metric of the best tree-path T_PTH31 is greater than the second cumulative metric of the worst path from the stack PTH2, MP2<M11+M20+M31, thus we go to step 14.

Step 14: We reorder the stack. Here, the path PTH1 is better than the path PTH2.

Step 15: Here, the top path's cumulative bits CBITS is not equal to the received sequence SQr length bits. Hence, we go to step 18.

Step 18: CPT=1, return to step 3.

Step 3: The tree-path list L_PTH is erased totally. The new top tree-path T_PTH is MP 1 with the node N00.

| CM_LPTH | NSET |   |
|---------|------|---|
| MP1     | N00  | T_PTH00 |

Step 4: We extend the branch from the node N00.

| CM_LPTH   | NSET      |   |
|-----------|-----------|---|
| MP1 + M10 | N00 – N10 | T_PTH10 |
| MP1 + M11 | N00 – N11 | T_PTH11 |

Step 5, step 6, and step 7: T_PH10 is the best tree-path BT_PTH, no codeword has been selected and T_PH10 corresponds to the symbol S1. We delete the best tree-path BT_PTH=T_PTH10 in the tree-path list.

Step 8: We delete the top path in the stack STCK PTH1.

Step 9: Then, in the stack STCK, we have

| CM_STCK        | CBITS | STAT  |      |
|----------------|-------|-------|------|
| MP1 = MP1 + M10 | 4     | S3 S1 | PTH1 |
| MP2            | 1     | S1    | PTH2 |

Step 5: We select the new best tree-path BT_PTH=T_PTH11.

Step 6: There was a codeword selected before, thus go to step 10

Step 10: The first cumulative metric of the best tree-path T_PTH11 is greater than the second cumulative metric of the worst path from the stack PTH2 MP2<MP1+M11, thus we go to step 14.

Step 14: We reorder the stack. It stays the same here, which means that the path PTH1 is better than the path PTH2.

Step 15, step 18: CPT=2, we return to step 3.

Step 3: the tree-path list L_PTH is erased totally. The new top tree-path T_PTH00 is MP 1 with the node N00.

| CM_LPTH | NSET |   |
|---------|------|---|
| MP1     | N00  | T_PTH00 |

Step 4: extension.

| CM_LPTH   | NSET      |   |
|-----------|-----------|---|
| MP1 + M10 | N00 – N10 | T_PTH10 |
| MP1 + M11 | N00 – N11 | T_PTH11 |

Step 5, step 6: Then we go on with the new best tree-path BT_PTH=T_PTH11 (N00–N11)

Step 7: it does not correspond to any codeword. We return to step 4.

Step 4: extension

| CM_LPTH         | NSET            |   |
|-----------------|-----------------|---|
| MP1 + M10       | N00 – N10       | T_PTH10 |
| MP1 + M11 + M20 | N00 – N11 – N20 | T_PTH20 |
| MP1 + M11 + M21 | N00 – N11 – N21 | T_PTH21 |

Step 5, step 6, and step 7: T_PTH21 (MP1+M1+M21, N00–N11–N21) is new best tree-path BT_PTH corresponding to no codeword. We return to step 4.

extension

| CM_LPTH               | NSET                  |   |
|-----------------------|-----------------------|---|
| MP1 + M10             | N00 – N10             | T_PTH10 |
| MP1 + M11 + M20       | N00 – N11 – N20       | T_PTH20 |
| MP1 + M11 + M21 + M32 | N00 – N11 – N21 – N32 | T_PTH32 |
| MP1 + M11 + M21 + M33 | N00 – N11 – N21 – N33 | T_PTH33 |

Step 5, step 6, and step 7: T_PTH32 (MP1+M1+M21+M32 N00–N11–N21–N32) is the new best tree-path BT_PTH corresponding to the codeword 110, i.e. to the symbol S4. We delete the best tree-path BT_PTH=T_PTH32 in the tree-path list L_PTH.

Step 8, 9: delete the top path TOP_PTH in the stack STCK, then, in the stack STCK, we have

| CM_STCK                       | CBITS | STAT     |      |
|-------------------------------|-------|----------|------|
| MP1 = MP1 ++ M11 + M21 + M32  | 7     | S3 S1 S4 | PTH1 |
| MP2                           | 4     | S5       | PTH2 |

| CM_LPTH               | NSET                  |   |
|-----------------------|-----------------------|---|
| MP1 + M10             | N00 – N10             | T_PTH10 |
| MP1 + M11 + M20       | N00 – N11 – N20       | T_PTH20 |
| MP1 + M11 + M21 + M33 | N00 – N11 – N21 – N33 | T_PTH33 |

Return to step 5: The new best tree-path is BT_PTH=T_PTH33.

Step 6, Step 10: The new first cumulative metric MP1+M11+M21+M33 exceeds the worst second cumulative metric in the stack STCK, which is MP2, hence we go to step 14.

Step 14: we reorder the stack. Here, it stays the same.

| CM_STCK                      | CBITS | STAT     |      |
|------------------------------|-------|----------|------|
| MP1 = MP1 + M11 + M21 + M32  | 7     | S3 S1 S4 | PTH1 |
| MP2                          | 1     | S1       | PTH2 |

Step 15: The top path's cumulative bits CBITS in the stack STCK is equal to the length of the received sequence L_SQ, which is 7, thus we go to step 16.

Step 16: a priori conditions: the number of symbols S is equal to the number of symbols within the emitted sequence SQs, which is 3. Hence, we stop and output the top path TOP_PTH=S3, S1, S4, which is the solution to the received sequence SQr=0.8–0.9–0.8–1.1 1.2–1.3.

IV) Performances.

Figure 6:
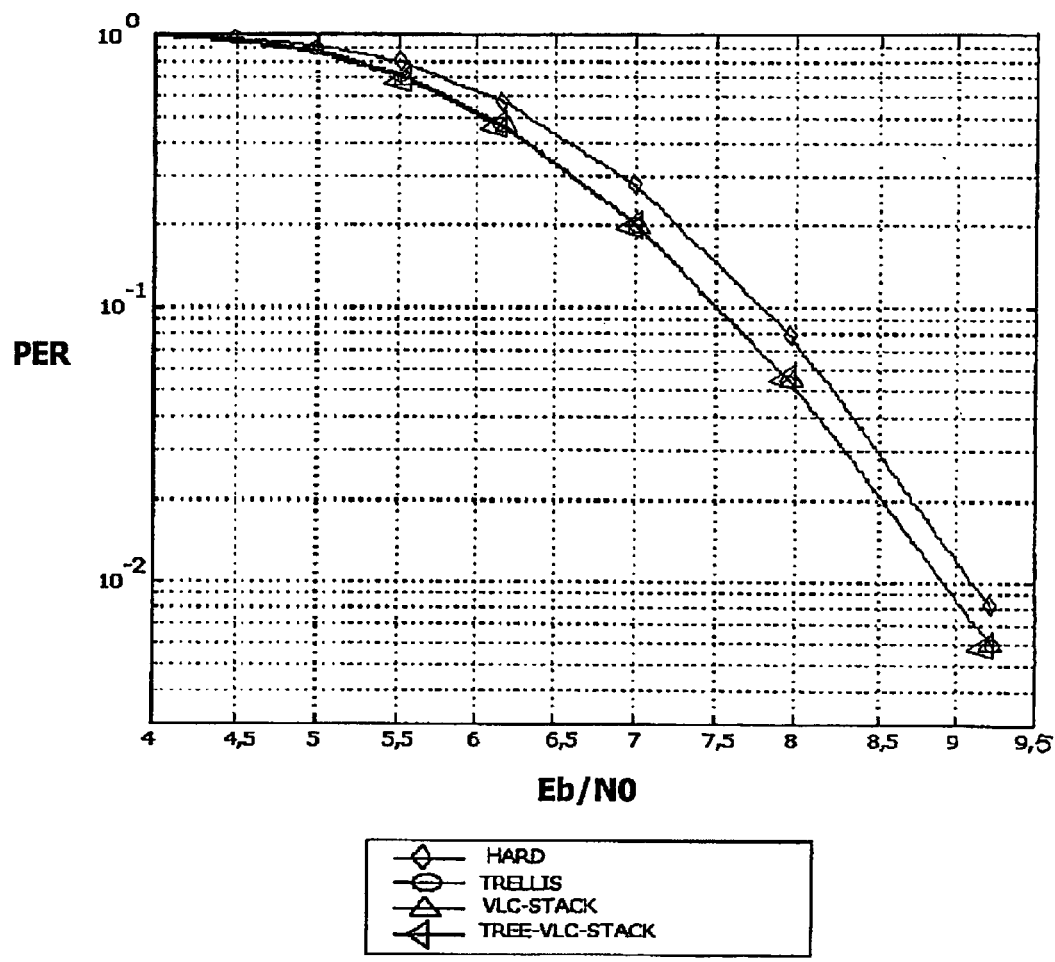
FIG. 6 is a graph showing a first performance of the method according to the invention illustrated in FIG. 1 compared with other methods.
Figure 7:
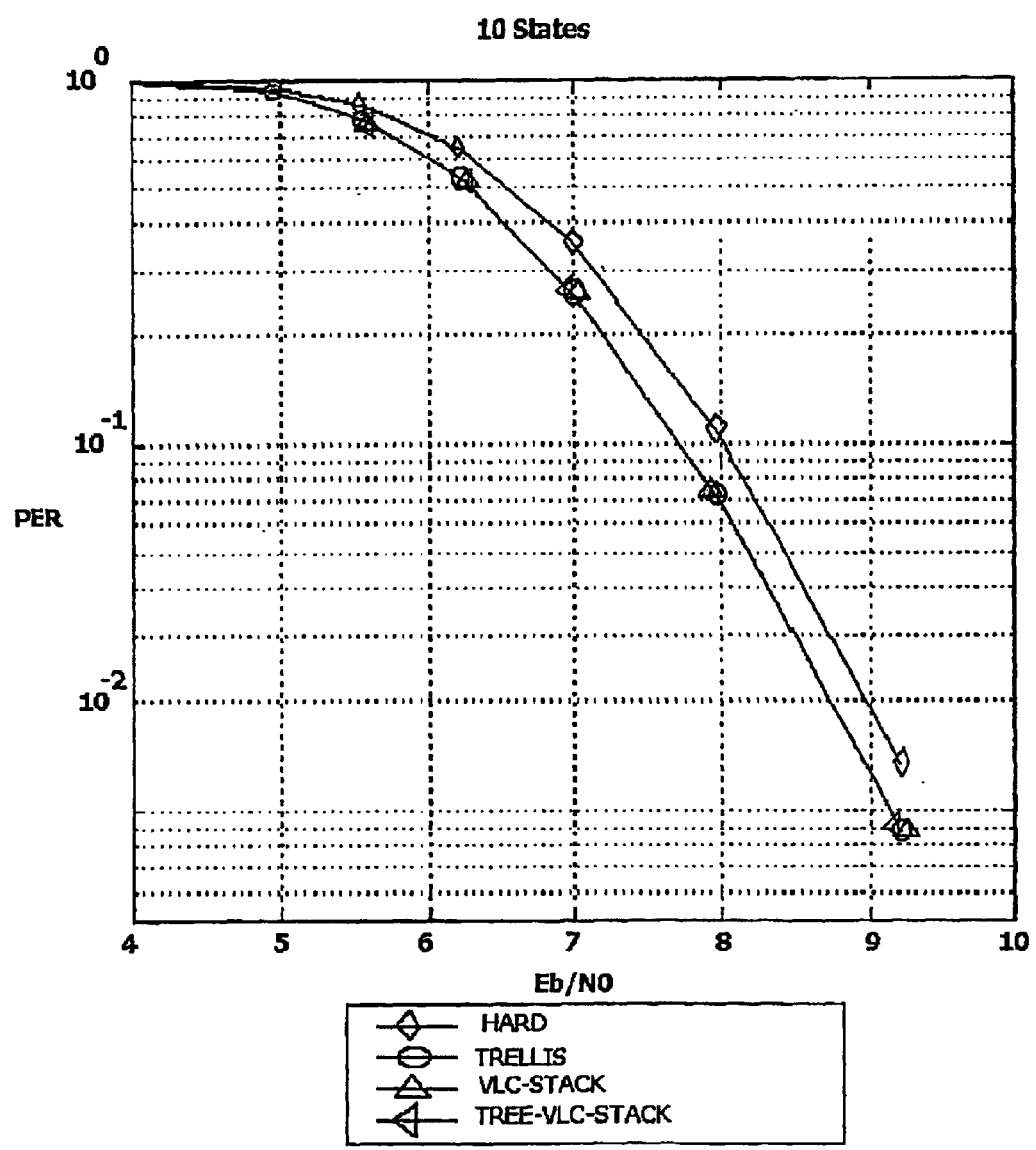
FIG. 7 is a graph showing a second performance of the method according to the invention illustrated in FIG. 1 compared with other methods.
Figure 8:
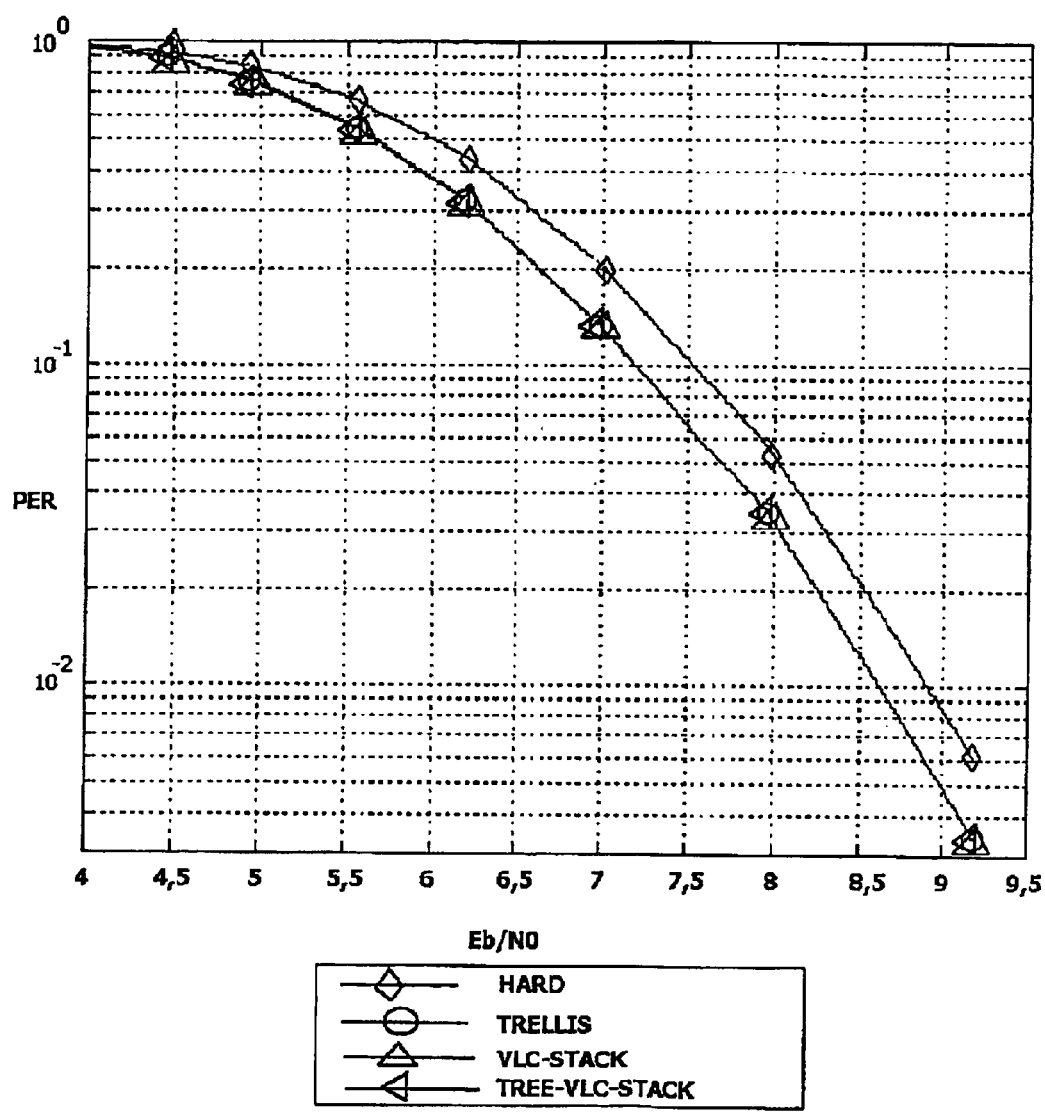
FIG. 8 is a graph showing a third performance of the method according to the invention illustrated in FIG. 1 compared with other methods.

FIG. 6, FIG. 7 and FIG. 8 show performances of the method according to the invention compared with other methods for source decoding of variable-length codeword sequences. The following method performances are illustrated:

- hard VLC decoding "HARD" (in diamonds),
- new symbol trellis algorithm "TRELLIS" (in circles) based on the Demir and Sayoud algorithm referenced "Joint Source Channel coding for variable length codes" In Proceedings of Data Compression Conference DCC'98, pages 139–148, Snowbird, Utah, USA, Mar. 30–Apr. 1 1998 with the use of formula [1] for the metric computation,
- VLC stack algorithm proposed by Buttigieg "VLC-STACK" (in triangles up) described as the prior art (reference "variable-length error-correcting codes" PhD thesis, University of Manchester, UK 1995), and
- Method according to the invention "TREE-VLC-STACK"(in triangles left).

The hard VLC method is the method that consists of decoding the received sequence SQr bit by bit using prefix properties of VLC codes. Prefix properties mean that one codeword cannot be the start of another codeword.

The other methods are soft VLC decoding methods.

All the graphs of FIG. 6, FIG. 7, and FIG. 8 show the performance by simulations, in terms of Packet Error Rate PER versus signal to noise ratio Eb/N0, a packet corresponding to a codeword sequence SQ. Note that the computation of signal-to-noise ratio is well-known to those skilled in the art. In other words, we calculate a performance versus a cost. The performance shows whether a codeword sequence has been correctly decoded, and the cost shows how much power (energy/noise) has been used to send the bits of a codeword sequence SQ. Then, depending on the error we accept to have and/or the power we want to use, we select the best solution. The optimal method and the hard method bound all performances.

Simulation characteristics are the following.

Codewords are transmitted in packets of 100,

Symbols are generated and VLC encoded with a given VLC table,

The channel noise is additive white and Gaussian,

A maximum number of survival paths used in the soft decoding methods, said maximum number being set to 10.

FIG. 6 presents simulation results with a 26 codeword table introduced by Bauer and Haugenauer (references "symbol by symbol MAP decoding of variable length codes" in Proceedings of third ITG Conference on Source and Channel Coding CSCC00, pages 111–116, Munich, Germany, January 2000).

FIG. 7 presents simulation results with a 208 codeword table defined by the MPEG4 Standard (references Rob Koenen "Overview of the MEPEG4 Standard" ISO/IEC JTC1/SC29/WG11 N3156, International organization for standardization, http://drogo.cselt.stet.it/mpeg/standards/mpeg-4/Mpeg-4.htm, March 2000).

FIG. 8 presents simulation results with a 1023 codeword UVLC table of maximum length 19 associated with a H.26L standard (references Gisle Bjontegaard, "H.26L Test Model Long Term Number 6" draft 0, ITU, Telecommunication Standardization Sector Study Group 16, http://standard.pictel.com/ftp/video-site/h26L/tml6d0.doc, March 2001).

These simulations show that all the soft decoding methods concerned, achieve nearly identical performances in terms of PER. Hence, a selection criterion would be the decoding complexity, rapidity and the required memory size.

Figure 9:
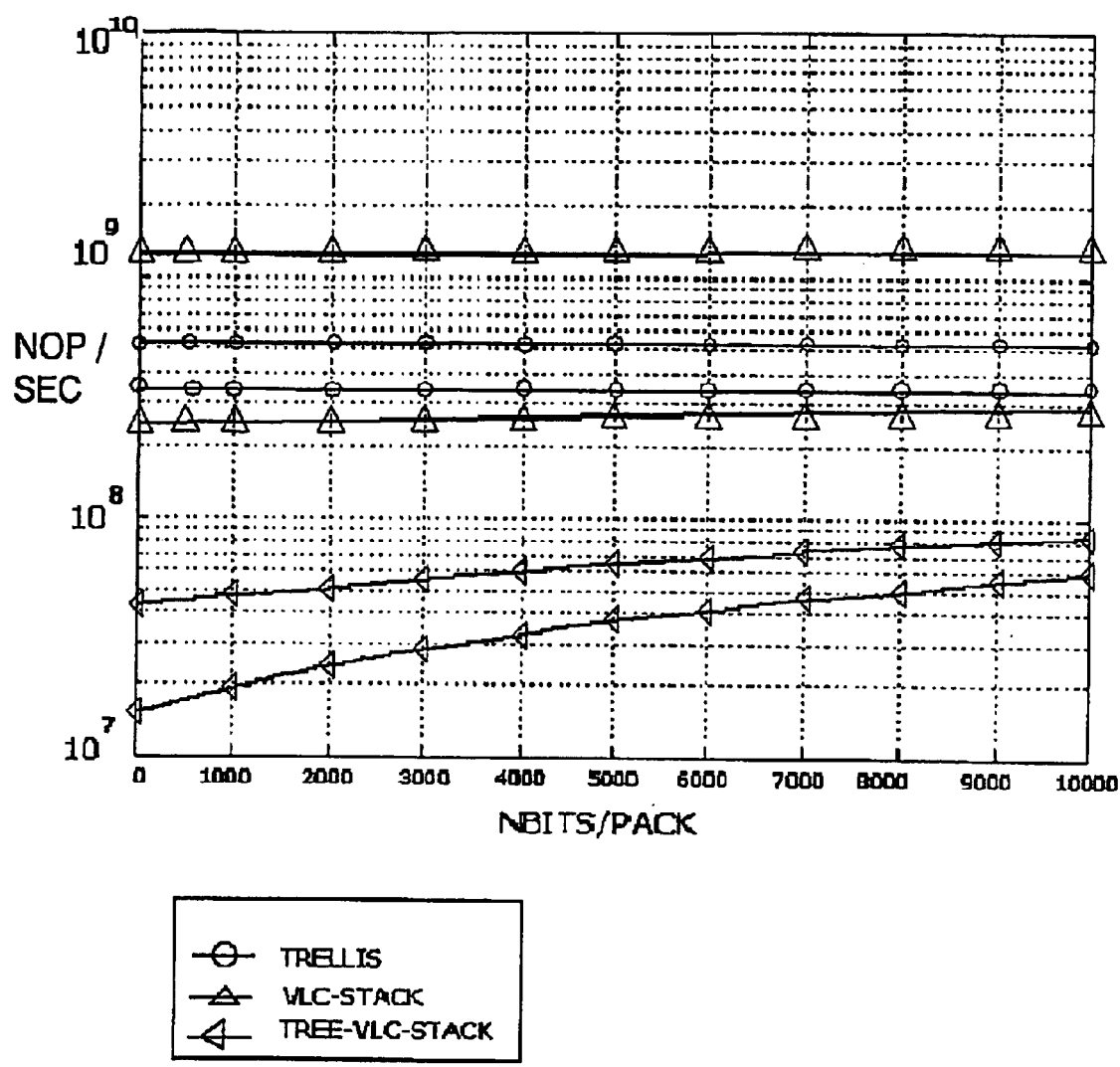
FIG. 9 is a graph showing complexity results of the method according to the invention illustrated in FIG. 1 compared with other methods.

FIG. 9 shows the performance of the TREE-VLC-STACK method according to the invention in terms of complexity compared with the other methods concerned. The Y-axis represents a number of operations by second NBOP/SEC. The X-axis represents a number of bits by packet NBITS/PACK.

As can be seen, the method according to the invention is much more efficient in terms of decoding complexity.

Figure 10:
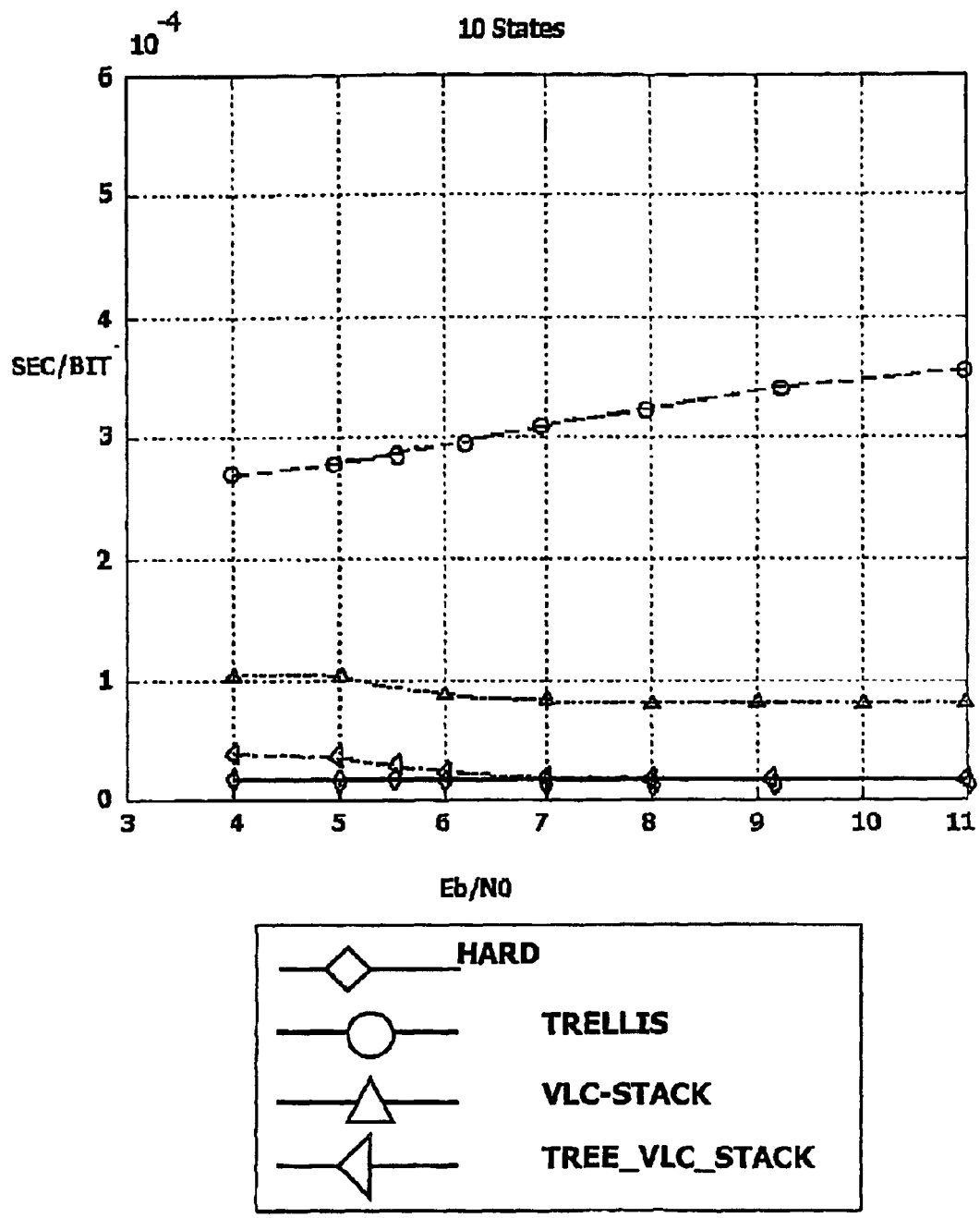
FIG. 10 is a graph showing rapidity results of the method according to the invention illustrated in FIG. 1 compared with other methods.

Moreover, as shown in FIG. 10, the proposed TREE-VLC-STACK method according to the invention is approximately 6 times less costly than the existing VLC-STACK method.

V) Application.

The proposed VLC decoding method according to the invention is preferably used for decoding noisy MPEG4 frames.

In the MPEG-4 video standard (references Rob Koenen. "Overview of the MPEG4 Standard". Final Maui version ISO/IE JTC1/SC29/WG11 N3156, International Organization for Standardization, http://drogo.cselt.stet.it/mpeg/standards/mpeg-4/mpeg-4.htm, March 2000 and Soares and Pereira "MPEG4: a flexible coding standard for the emerging mobile multimedia applications" in proceedings of IEEE International Symposium on Personal Indoor and Mobile Radio Communications, Boston, USA, September 1998), an image scene is structured as a composition of relevant objects. For each object, shape, motion and texture data are coded. Contrary to shape and motion data, the texture data is entirely VLC encoded. Moreover, MPEG-4 has defined a data partitioning mode, which reorders the data inside a packet, MPEG-4 data being sent by packets. In this way, the shape and motion data is separated from the texture data by a marker. Proposed soft decoding techniques can then be successfully used over MPEG-4 texture partitions in the data partitioning mode.

Texture coding is block-based: 8×8 blocks are encoded using the Discrete Cosine Transform (DCT), quantized and mapped to bits by run-length coding and variable length coding related to EVENTs. An EVENT is a combination of a last non-zero coefficient indication (if LAST is set to "0", there are more non-zero coefficient in this block, if LAST is set to "1", it means that this is the last non-zero coefficient in this block), the number of successive zeros preceding a first coded coefficient RUN and the non-zero value of a second coded coefficient LEVEL.

A possible EVENT can be represented by a VLC code. However, some possible EVENTs have no VLC code to represent them. These EVENTs are statistically rare. In order to encode these statistically rare combinations, an Escape Coding method is used using an escape mode codeword ESC, this Escape Coding method is well known in the MPEG-4 standard. It consists of three types of escape-mode codewords ESC.

Type 1: an escape mode codeword ESC followed by "0".
Type 2: an escape mode codeword ESC followed by "10".
Type 3: an escape mode codeword ESC followed by "11" and by a fixed length code of length 21.

These three types are described in the reference by Rob Koenen, "Overview of the MPEG4 Standard".

Due to the escape mode codeword, soft decoding algorithms cannot be applied directly on the MPEG-4 texture partition. However, for the two first types (type 1 and type 2) of escape mode codewords ESC, a proposed solution is that we artificially include these escape mode codewords ESC with their respectively additive bits "0" and "10" in the VLC codeword table. Thus, the codeword table comprises escape mode codewords ESC, and these escape mode codewords ESC are then used similarly as any other VLC codeword.

For the third type 3 of escape mode ESC, a proposed solution is as follows. At the 14$^{th}$ step REORDER_STCK), just before reordering the stack STCK, we consider the issue of escape mode codeword of type 3: we calculate the metric of the escape mode codeword of type 3 as described below. We add this metric to the second cumulative metric CM_STCK of the path PTH we are working on (the best path in the stack). Then, we compare it with the second cumulative metric CM_STCK of the worst path PTH in the stack STCK. If it is better than this CM_STCK, we replace the worst path PTH in the stack STCK by the new path PTH formed by extending the best path in the stack STCK by the escape mode codeword ESC followed by 11 and by the hard values of 21 following received bits. Note that this extended path is characterized by the above-mentioned cumulative metric and a cumulative number of bits CBITS equal to the cumulative number of bits CBITS of the top path concerned +30.

We go to step 14 in any case.

The metric of an escape mode codeword of type 3 followed by a fixed length code at time t is as follows.

$$M("ESC+11", y[t:t+8]) + \sum_{i=9}^{29} \left( \|y[t+i] - sign(y[t+i])\|^2 - \log\frac{1}{2} + \log P_0(y[t+i]) \right)$$

Regarding the a priori conditions used in the proposed VLC decoding algorithm, soft VLC decoding algorithms often use the a priori knowledge of the number of symbols by sequence to make the estimation of the transmitted sequence more accurate. Unfortunately, in the standard MPEG4, the knowledge of the number of symbols contained in each texture partition cannot be known from the MPEG-4 frame (except of course by completely and correctly decoding the frame). However, by decoding headers and motion partition, one can know the number of blocks contained in the texture partition.

Therefore, for the MPEG-4 standard, in the proposed VLC decoding algorithm according to the invention, we will use the a priori knowledge of the number of blocks within a texture partition to perform the decoding.

Indeed, it is easy to determine the number of blocks contained in a given sequence of codewords by counting the number of codewords corresponding to a LAST parameter equal to 1. Thus, the knowledge of the number of blocks by partition is a priori information that can be used as the number of symbols to select a likely sequence, in the sense that it contains the exact number of blocks. Hence, in the 16$^{th}$ step of the proposed VLC algorithm, we compare the number of blocks of the decoded sequence with the number of blocks of the sent sequence SQs, which is known.

Note that if the a priori conditions are based on block criteria, we can gain time by not selecting two codewords of the same length which correspond to the same LAST parameter value.

It is to be understood that the present invention is not limited to the afore-mentioned embodiments and variations and modifications may be made without departing from the spirit and scope of the invention as defined in the appended claims. In this respect, the following closing remarks are made.

It is to be understood that the present invention is not limited to the afore-mentioned MPEG4 application. It can be used within any application using variable-length coding and which can support the cost of said decoding. Typically, this can be used for instance in video, audio or text compression.

It is to be understood that the method according to the present invention is not limited to any implementation.

There are numerous ways of implementing functions of the method according to the invention by means of items of hardware or software, or both, provided that a single item of hardware or software can carry out several functions. It does not exclude that an assembly of items of hardware or software or both carries out a function. For example, the tree-path extension step 4) can be combined with the selection of the new best tree-path BT_PTH step 5), thus forming a single function without modifying the method of source Decoding according to the invention.

Said hardware or software items can be implemented in several manners, such as by means of wired electronic circuits or by means of an integrated circuit that is suitably programmed. The integrated circuit may be incorporated in a computer or in a decoder. The decoder comprises tree-path extension means adapted to perform the extension step 4), and selection means adapted to perform the selection step 5), as described previously, said means being hardware or software items as stated above.

The integrated circuit comprises a set of instructions. Thus, said set of instructions contained, for example, in a computer programming memory or in a decoder memory may cause the computer or the decoder to carry out the different steps of the VLC decoding method.

The set of instructions may be loaded into the programming memory by reading a data carrier such as, for example, a disk. A service provider may also make the set of instructions available via a communication network such as, for example, the Internet.

Any reference sign in the following claims should not be construed as limiting the claim. It will be obvious that the use of the verb "to comprise" and its conjugations does not exclude the presence of steps or elements other than those defined in any claim. The article "a" or "an" preceding an element or step does not exclude the presence of a plurality of such elements or steps.

What is claimed is:

1. A method of source decoding a variable-length codeword sequence (SQr), said source decoding being based on a codeword table, characterized in that it comprises the steps of:

creating a tree associated with said codeword table, said tree comprising tree-paths (T_PTH), a tree-path CT_PTH) comprising a plurality of branches (B), decoding a received codeword sequence (SQr), said step comprising the sub-steps of:

extending the best tree-paths (BT_PTH) from a node (N) in the tree by computing first cumulative metrics (CM_LPTH) of the succeeding branches (B) coming from said node (N), selecting the codewords (CWDi) corresponding to the best tree-paths (BT_PTH), and saving corresponding data in paths (PTH), the corresponding data comprising a second cumulative metric (CM_STCK), reordering the saved paths (PTH) in accordance with their second cumulative metrics (CM_STCK), testing a priori conditions on top path (TOP_PTH), and if they are verified, outputting said top path (TOP_PTH), or otherwise returning to the extension sub-step.

2. A method as claimed in claim 1, characterized in that each codeword (CWDi) has a length (LTHi), and that the tree comprises a number of levels equal to the maximum codeword length (LTHi) defined in the codeword table.

3. A method as claimed in claim 1, characterized in that the extension sub-step comprises a stop metric computation conditions test, such that, if said conditions are verified, the extension is stopped and is followed by the sub-step of reordering paths.

4. A method as claimed in claim 3, characterized in that the stop metric computation conditions test is based on a comparison of the first cumulative metric (CM_LPTH) of the best tree-path (BT_Pm) with the worst saved path's second cumulative metric (CM_STCK).

5. A method as claimed in claim 1, characterized in that, if a priori conditions are based on symbols criteria, the selection sub-step is adapted to select only a codeword (CDWi) which has a length (LTHi) different from all previously selected codeword lengths within the decoding step.

6. A method as claimed in claim 1, wherein the decoding step further comprises a sub-step of testing end conditions on the top path (TOP_PTH) before testing the a priori conditions, such that, if said top path (TOP_PTH) verifies end conditions, the sub-step of testing the a priori conditions is performed, or otherwise, a sub-step of testing stop decoding conditions is performed, and if said stop decoding conditions are not verified, a return to the extension step takes place.

7. A method as claimed in claim 6, characterized in that the stop decoding conditions are based on an incrementation of a decoding step counter (CPT) and on a comparison of said counter (CPT) with a set threshold (TH), such that if said counter (CPT) exceeds said threshold (TH), the decoding is stopped.

8. A method as claimed in claim 6, characterized in that the corresponding data in paths (PTH) further comprise a cumulative number of bits (CBITS), and that the end conditions are based on a comparison of the top path's cumulative number of bits (CBITS) with the length (L_SQ) of the received codeword sequence (SQr).

9. A method as claimed in claim 1, characterized in that the codeword table comprises escape mode codewords (ESC).

10. A computer program product for a decoder, comprising a set of instructions, which, when loaded into said decoder, causes the decoder to carry out the method as claimed in claim 1.

11. A computer program product for a computer, comprising a set of instructions, which, when loaded into said computer, causes the computer to carry out the method as claimed in claim 1.

12. A decoder for source decoding variable-length codeword sequences, said source decoding being based on an associated codeword table, characterized in that said decoder comprises:

tree creation means adapted to create a tree associated with the codeword table, said tree comprising tree-paths (T_PTH), a tree-path (T_PTH) comprising a plurality of branches (B), sequence decoding means adapted to decode a received sequence (SQr), said decoding means comprising:

best tree-path extension means adapted to extend the best tree-paths (BT_PTH) from a node (N) in the tree by computing first cumulative metrics (CM_LPTH) of the succeeding branches (B) coming from said node (N), codeword selection means adapted to select the codewords (CWDi) corresponding to the best tree-paths (BT_PTH), and to save corresponding data in paths (PTH), the corresponding data comprising a second cumulative metric (CM_STCK), paths reordering means adapted to reorder the saved paths (PTH) in accordance with their second cumulative metrics (CM_STCK), and, a priori condition test means adapted to test a priori conditions on top path (TOP_PTH), and if they are verified, to output said top path (TOP_PTH).

* * * * *